(12) United States Patent
Lebrun et al.

(10) Patent No.: US 11,232,884 B2
(45) Date of Patent: Jan. 25, 2022

(54) DIELECTRIC FLUID COMPRISING FATTY ACID ESTERS

(71) Applicant: ARKEMA FRANCE, Colombes (FR)

(72) Inventors: Stéphanie Lebrun, Nassandres (FR); Frédéric Mandon, Gouvieux (FR); Romain Lenoir, La Garenne Colombes (FR)

(73) Assignee: Arkema France, Colombes (FR)

( * ) Notice: Subject to any disclaimer, the term of this patent is extended or adjusted under 35 U.S.C. 154(b) by 316 days.

(21) Appl. No.: 16/314,365

(22) PCT Filed: Jun. 29, 2017

(86) PCT No.: PCT/FR2017/051737
§ 371 (c)(1),
(2) Date: Feb. 14, 2020

(87) PCT Pub. No.: WO2018/002529
PCT Pub. Date: Jan. 4, 2018

(65) Prior Publication Data
US 2020/0279670 A1    Sep. 3, 2020

(30) Foreign Application Priority Data
Jun. 29, 2016 (FR) ...................... 1656072

(51) Int. Cl.
*H01B 3/20* (2006.01)
*C11C 3/00* (2006.01)
*H01F 27/12* (2006.01)

(52) U.S. Cl.
CPC ............... *H01B 3/20* (2013.01); *C11C 3/003* (2013.01); *H01F 27/12* (2013.01)

(58) Field of Classification Search
CPC ...................................................... H01B 3/20
See application file for complete search history.

(56) References Cited

U.S. PATENT DOCUMENTS

| 2002/0027219 A1 | 3/2002 | Oommen et al. | |
| 2008/0283803 A1* | 11/2008 | Rapp ........................ | H01B 3/20 252/578 |
| 2009/0140830 A1* | 6/2009 | Amanullah .............. | H01B 3/22 336/94 |
| 2014/0252281 A1 | 9/2014 | Han et al. | |
| 2015/0228373 A1 | 8/2015 | Martin et al. | |
| 2020/0279670 A1* | 9/2020 | Lebrun .................... | H01F 27/12 |

FOREIGN PATENT DOCUMENTS

| EP | 1 623 785 A1 | 2/2006 | |
| EP | 1623785 A1 * | 2/2006 | ............... B23H 1/08 |
| EP | 1623785 A1 | 2/2006 | |
| EP | 1 662 513 A1 | 5/2006 | |
| EP | 1662513 A1 * | 5/2006 | ............... H01B 3/20 |
| EP | 1662513 A1 | 5/2006 | |
| WO | WO 2004/108871 A2 | 5/2004 | |
| WO | WO 2004/108871 A2 | 12/2004 | |
| WO | WO 2004/108871 A3 | 12/2004 | |
| WO | WO-2004108871 A2 * | 12/2004 | ............... C11C 3/10 |
| WO | WO 2007/041785 A1 | 4/2007 | |
| WO | WO-2007041785 A1 * | 4/2007 | ............... H01B 3/22 |
| WO | WO 2012/001043 A1 | 1/2012 | |
| WO | WO 2013/043311 A1 | 3/2013 | |
| WO | WO-2013043311 A1 * | 3/2013 | ............... H01B 3/20 |

OTHER PUBLICATIONS

International Search Report and Written Opinion received in corresponding International Patent Application No. PCT/FR2017/051737 dated Oct. 6, 2017.
Suwarno, et al., Effects of temperature on dielectric properties of rhicinnus oils as insulating liquid. 2008 International Conference on Condition Monitoring and Diagnosis. Jul. 29, 2008, Whole document.
Written opinion issued in corresponding Singapore application No. 11201811427Y dated Jul. 1, 2021.

* cited by examiner

*Primary Examiner* — Liam J Heincer
*Assistant Examiner* — M. Reza Asdjodi
(74) *Attorney, Agent, or Firm* — Knobbe, Martens, Olson & Bear, LLP

(57) ABSTRACT

A method of manufacturing an electrical device includes providing a composition comprising a mixture of vegetable oil fatty acid esters as a dielectric fluid in an electrical apparatus. The mixture of castor oil fatty acid methyl esters can contain the methyl stearate in a mass content of 1 to 20% to total amount of the mixture, the methyl oleate in a mass content of 1 to 90% to total amount of the mixture, the methyl linoleate in a mass content of 1 to 80% to total amount of the mixture, the methyl palmitate in a mass content of 1 to 50% to total amount of the mixture, the methyl ricinoleate in a mass content of 0 to 4% to total amount of the mixture, and the 10-undecylenic acid in a mass content of 0 to 1%.

12 Claims, No Drawings

DIELECTRIC FLUID COMPRISING FATTY ACID ESTERS

FIELD OF THE INVENTION

The present invention relates to the use of a composition based on fatty acid (preferably methyl) esters, preferably derived from castor oil, as a dielectric fluid in various electrical devices such as transformers and capacitors.

TECHNICAL BACKGROUND

Many electrical devices such as capacitors and transformers contain a dielectric (or insulating) fluid. The function of this fluid is to isolate the high-voltage components from the other parts of the device and to convey the heat to the environment in order to cool the unit.

It is known to use mineral oils as dielectric fluids in these applications. Moreover, in an effort to reduce the environmental impact of dielectric fluids, compositions based on vegetable oils have also been proposed. They are generally formulated with antioxidant type additives allowing to improve the oxidation stability of the fluid.

Thus, document US 2002/027219 describes an oleic acid-rich oil composition used as an electrical insulation fluid, suitable for electrical devices in combination with several antioxidant type additives, pour point depressant additives and copper deactivators.

Document US 2008/283803 discloses a dielectric fluid composition comprising a pretreated vegetable oil (i.e. refined, bleached and deodorized), one or more antioxidant compounds, and one or more pour point depressant agents.

Dielectric fluids containing ester compounds are also known.

Thus, document WO 2012/001043 proposes an additive derived, for example, from oleic acid, modified by reaction with an isopropyl chloroformate type compound, for dielectric oils. Advantages in terms of viscosity reduction, oxidation stability, increase in permittivity, and pour point reduction are discussed.

Document US 2014/252281 relates to the use of a functionalized methyl-12-hydroxymethyl-stearate type synthetic esters obtained by hydroformylation and hydrogenation of oleic acid.

Document US 2015/0228373 discloses the use of synthetic esters with one or more additives (antioxidants, metal deactivators and pour point depressant agents) as dielectric fluids in electrical devices. The synthetic esters are prepared by reacting pentaerythritol with certain selected carboxylic acids.

Furthermore, document EP 1623785 discloses the use of fatty acid methyl and ethyl esters, mainly based on oleic acid, as a dielectric fluid in a completely different application, namely electro-erosion machining and more particularly electric discharge machines (EDM). In this application, the machining tool and the machined part are immersed in a dielectric fluid.

There is a need to provide dielectric fluid compositions for electrical devices such as capacitors and transformers having low environmental impact and having high electrical insulation performance, particularly in terms of breakdown voltage.

SUMMARY OF THE INVENTION

The invention primarily relates to the use of a composition comprising a mixture of vegetable oil fatty acid esters as a dielectric fluid in an electrical device. According to one embodiment, the electrical device is chosen from transformers, capacitors and electric cables.

According to one embodiment, the vegetable oil is castor oil.

According to one embodiment, the mixture of vegetable oil fatty acid esters is a mixture of vegetable oil fatty acid methyl esters.

According to one embodiment, the mixture of vegetable oil fatty acid esters comprises:
- methyl stearate, preferably in a mass content of 1 to 20%, more preferably less than 15%; and/or
- methyl oleate, preferably in a mass content of 1 to 90%, more preferably of 25 to 35%; and/or
- methyl linoleate, preferably in a mass content of 1 to 80%, more preferably of 35 to 45%; and/or
- methyl palmitate, preferably in a mass content of 1 to 50%, preferably less than 10%; and/or
- methyl ricinoleate, preferably in a mass content of 0 to 4%, more preferably of 2 to 3%; and/or
- 10-undecylenic acid, preferably in a mass content of 0 to 1%.

According to one embodiment, the composition essentially consists, or even consists, of the mixture of vegetable oil fatty acid esters.

According to one embodiment, the composition comprises a pour point depressant additive, preferably in a mass proportion of 0.1 to 5%, preferably of 1 to 2%.

According to one embodiment, the composition essentially consists, or even consists, of the mixture of vegetable oil fatty acid esters and the pour point depressant additive.

According to one embodiment, the pour point depressant additive is an acrylic polymer dissolved in an oil.

The invention also relates to an electrical device comprising an enclosure containing a composition comprising a mixture of vegetable oil fatty acid esters as a dielectric fluid.

According to one embodiment, the electrical device is chosen from transformers, capacitors and electric cables.

According to one embodiment, the composition in the electrical device is as described above.

The present invention makes it possible to overcome the disadvantages of the prior art. More particularly, it provides dielectric fluid compositions for electrical devices such as capacitors and transformers, having low environmental impact and having high electrical insulation performance.

This is accomplished by providing compositions based on fatty acid methyl esters obtained by transesterification of vegetable oil.

In some advantageous embodiments of the invention:
- the compositions according to the invention have a high breakdown voltage that is greater than the minimum specification required by the IEC 62770 standard;
- the compositions according to the invention may be produced easily and at a moderate cost;
- the compositions according to the invention have a low viscosity;
- the compositions according to the invention exhibit good biodegradability;
- the compositions according to the invention may contain little or no additives (expensive, toxic and non-biodegradable) such as the antioxidants or the metal deactivators commonly used in the formulations of the prior art.

DETAILED DESCRIPTION OF THE PREFERRED EMBODIMENT

The invention is now described in more detail and without limitation in the description which follows.

The invention relates to the use of a composition comprising a mixture of vegetable oil fatty acid esters, preferably vegetable oil fatty acid methyl esters, as a dielectric fluid in an electrical device.

This mixture of vegetable oil fatty acid esters is a mixture which may be obtained by transesterification of a vegetable oil with an alcohol, preferably a linear alcohol, more preferably a C1 to C5 linear alcohol, preferably C1 to C2.

Possible alcohols are methanol, ethanol, propanol, butan-1-ol, butan-2-ol, 2-methylpropan-1-ol, 2-methylpropan-2-ol, pentan-1-ol, pentan-2-ol, pentan-3-ol, 2-methylbutan-1-ol, 2-methylbutan-2-ol, 3-methylbutan-2-ol, 3-methylbutan-1-ol, and 2,2-dimethylpropan-1-ol.

A mixture of the above alcohols may also be used.

Preferably the alcohol comprises methanol. More preferably, only methanol is used.

The transesterification rate of the mixture is not necessarily 100%, which means that the ester mixture in question may comprise a certain proportion of unesterified fatty acids.

The vegetable oil may be pretreated before the transesterification step. However, it is preferably not pretreated before this step. It may advantageously undergo a post-treatment step after the transesterification, such as purification by distillation.

It should be noted that the fatty acid composition varies considerably from one vegetable oil to another.

The vegetable oil may notably be a castor oil, a rapeseed oil, a soybean oil, a sunflower oil, an olive oil, a cottonseed oil, a palm oil, a coconut oil, a corn oil, a seaweed oil, an Abyssinian oil, a safflower oil, a lesquerella oil or a mixture thereof.

More particularly preferably, it may be a castor oil.

The fatty acid ester mixture concerned by the present invention derives from fatty acids which are saturated and unsaturated, and preferably have chain lengths comprised between C8 and C26, preferably between C10 and C22; wherein these fatty acids preferentially include palmitic (C16), stearic (C18) oleic (C18:1) and linoleic (C18:2) acids.

According to one embodiment, the mixture of vegetable oil fatty acid esters comprises methyl oleate (C18:1), preferably in a mass content of 1 to 90%, preferably of 20 to 40%, more preferably of 25 to 35%.

According to one embodiment, the mixture of vegetable oil fatty acid esters comprises methyl linoleate (C18:2), preferably in a mass content of 1 to 80%, preferably of 30 to 50%, more preferably of 35 to 45%.

According to one embodiment, the mixture of vegetable oil fatty acid esters comprises methyl stearate (C18:0), preferably in a mass content of 1 to 20%, preferably of 5 to 20%, more preferably less than 6 to 15%, and more preferably of 8 to 12%.

According to one embodiment, the mixture of vegetable oil fatty acid esters comprises methyl palmitate (C16:0), preferably in a mass content of 1 to 50%, preferably in a mass content of less than 10%, and more preferably less than 8.5%.

According to one embodiment, the mixture of vegetable oil fatty acid esters comprises methyl ricinoleate (C18:1 (OH)), preferably in a mass content of 0% to 4%, more preferably of 1.5 to 4%, and in particular of 2 to 3%.

According to one embodiment, the mixture of vegetable oil fatty acid esters comprises 10-undecylenic acid (C11:1), preferably in a mass content of 0 to 1.5%, more preferably of 0.4 to 1.2%, and, in particular of 0.6 to 1%.

Such a product is notably marketed by Arkema under the designation Oleris® Esterol A.

According to one embodiment, the mixture of vegetable oil fatty acid esters simultaneously comprises methyl stearate, methyl oleate, methyl linoleate, methyl palmitate, and may contain methyl ricinoleate and 10-undecylenic acid, preferably in the mass contents indicated above.

Alternatively, if another alcohol than methanol is used for the transesterification, the mixture of vegetable oil fatty acid esters may comprise the various esters mentioned above, preferably in the proportions mentioned above, by replacing the term "methyl" by another alkyl group (e.g. "ethyl" if ethanol is used, etc.).

According to one embodiment, the composition of the invention is devoid of pour point depressant additive.

According to an alternative embodiment, the composition of the invention comprises a pour point depressant additive.

The pour point depressant additive is preferably selected so that it enables the pour point of the composition according to the invention to be lowered below 0° C. (preferably below −1° C., or −2° C., or −3° C., or −4° C., or −5° C., or −6° C., or −7° C., or −8° C., or −9° C. according to the ASTM D97 standard).

Suitable pour point depressants include acrylic polymers (which includes acrylic copolymers), preferably a polyalkyl methacrylate. A particularly suitable additive is the product marketed by Evonik under the reference VISCOPLEX® 1-211.

The additive may be present in the composition in a mass proportion of 0.1 to 5%, and preferably of 1 to 2%.

A mixture of castor oil fatty acid (methyl) esters with such a pour point depressant additive is notably marketed by Arkema under the designation Oleris® Esterol F.

According to one embodiment, the composition of the invention may comprise other dielectric compounds or various additives, such as antioxidants or metal deactivators.

However, it is preferred that the composition of the invention is essentially devoid, or even completely devoid, of such compounds and additives.

In particular, according to one embodiment, the composition of the invention is essentially devoid, or totally devoid, of antioxidant.

According to one embodiment, the composition of the invention is essentially devoid, or totally devoid, of metal deactivator.

According to one embodiment, the composition of the invention consists essentially of the mixture of vegetable oil fatty acid esters and, where appropriate, the pour point depressant additive described above. According to another embodiment, the composition consists of the mixture of vegetable oil fatty acid esters and, where appropriate, the pour point depressant additive.

EXAMPLES

The following examples illustrate the invention without limiting it.

Various properties that are important for use as dielectric fluid have been determined on the products marketed by Arkema under the references Oleris® Esterol A and F, which are compositions in accordance with the invention.

The results are summarized in the table below. The required thresholds are based on the IEC 62770 standard.

| Property | Test method | Threshold | Oleris ® Esterol A | Oleris ® Esterol F |
|---|---|---|---|---|
| Viscosity at 40° C. | ISO 3104 | Max. 18 $mm^2s^{-1}$ | <5 $mm^2s^{-1}$ | <10 $mm^2s^{-1}$ |
| Breakdown voltage | CEI 60156 | Min. 35 kV | 78 kV | 76 kV |
| Fire point | ISO 2592 (open cup) | Min. 175° C. | 198° C. | 192° C. |
| Flash point | ISO 3679 (closed cup) | Min. 135° C. | 173° C. | 167° C. |
| Biodegradation | US EPA OCDE 301 B | Easily biodegradable | Easily biodegradable 75% after 28 days | Easily biodegradable 75% after 28 days |

In addition to having breakdown voltage values that are significantly higher than the minimum specification of 35 kV, both products comply with the physical (viscosity at 40° C.) and safety (fire point 175° C., flash point 135° C.) criteria, and are easily biodegradable.

The breakdown voltages were then compared with those of other plant-based products containing triglycerides and additives (antioxidants and/or metal deactivators).

The composition of comparative example 1 contains more than 98.5% of soybean oil, less than 1% of antioxidant, less than 1% of pour point depressant, and less than 1% of dye.

The composition of comparative example 2 contains 98.4% of sunflower oil with a high oleic acid content and 1.6% of antioxidants and of metal deactivator.

| Product | Oleris ® Esterol A | Oleris ® Esterol F | Comparative example 1 | Comparative example 2 |
|---|---|---|---|---|
| Breakdown voltage (kV) | 78 | 76 | 47 | 45 |

The Oleris® Esterol A and F products, in addition to their low viscosity, their biodegradability, their plant origin, and the absence of antioxidant and metal deactivator in their composition, therefore have intrinsic breakdown tensions far higher than dielectric fluids based on vegetable oil and formulated with additives.

What is claimed is:

1. A method of isolating high-voltage components from other parts of an electrical device and conveying heat from the electrical device to the environment in order to cool the electrical device, comprising applying a composition consisting of a mixture of castor oil fatty acid methyl esters as a dielectric fluid in the electrical device.

2. The method according to claim 1, wherein the electrical device is selected from the group consisting of transformers, capacitors and electric cables.

3. The method according to claim 1, wherein the mixture of castor oil fatty acid methyl esters comprises at least one compound selected from the group consisting of methyl stearate, methyl oleate, methyl linoleate, methyl palmitate, methyl ricinoleate, and 10-undecylenic acid, preferably in a mass content of 0 to 1%.

4. The method according to claim 3, wherein the mixture comprises methyl stearate in a mass content of 1 to 20%.

5. The method according to claim 3, wherein the mixture comprises methyl oleate in a mass content of 1 to 90%.

6. The method according to claim 3, wherein the mixture comprises methyl linoleate in a mass content of 1 to 80%.

7. The method according to claim 3, wherein the mixture comprises methyl palmitate in a mass content of 1 to 50%.

8. The method according to claim 3, wherein the mixture comprises methyl ricinoleate in a mass content of 0 to 4%.

9. The method according to claim 3, wherein the mixture comprises 10-undecylenic acid in a mass content of 0 to 1%.

10. An electrical device comprising an enclosure containing a composition consisting of a mixture of castor oil fatty acid methyl esters as a dielectric fluid.

11. An electrical device according to claim 10, which is selected from the group consisting of transformers, capacitors and electric cables.

12. An electrical device according to claim 10, wherein the mixture of castor oil fatty acid methyl esters comprises at least one compound selected from the group consisting of methyl stearate, methyl oleate, methyl linoleate, methyl palmitate, methyl ricinoleate and 10-undecylenic acid.

* * * * *

UNITED STATES PATENT AND TRADEMARK OFFICE
CERTIFICATE OF CORRECTION

PATENT NO. : 11,232,884 B2
APPLICATION NO. : 16/314365
DATED : January 25, 2022
INVENTOR(S) : Lebrun et al.

It is certified that error appears in the above-identified patent and that said Letters Patent is hereby corrected as shown below:

In the Specification

Column 5, Line 16, delete "point" and insert -- point $\geq$ -- (first correction).

Column 5, Line 16, delete "point" and insert -- point $\geq$ -- (second correction).

Signed and Sealed this
Sixteenth Day of August, 2022

Katherine Kelly Vidal
*Director of the United States Patent and Trademark Office*